(12) United States Patent
Yagami et al.

(10) Patent No.: US 7,109,045 B2
(45) Date of Patent: Sep. 19, 2006

(54) METHOD FOR PREPARING A RING-FORMED BODY, AND MAGNETIC MEMORY DEVICE AND METHOD FOR MANUFACTURING THE SAME

(75) Inventors: Kojiro Yagami, Miyagi (JP); Makoto Motoyoshi, Kanagawa (JP)

(73) Assignee: Sony Corporation, Tokyo (JP)

( * ) Notice: Subject to any disclaimer, the term of this patent is extended or adjusted under 35 U.S.C. 154(b) by 144 days.

(21) Appl. No.: 10/786,259

(22) Filed: Feb. 25, 2004

(65) Prior Publication Data
US 2004/0166640 A1    Aug. 26, 2004

(30) Foreign Application Priority Data
Feb. 26, 2003    (JP)    ............................ P2003-048614

(51) Int. Cl.
    *H01L 21/00* (2006.01)
(52) U.S. Cl. .......................................... 438/3; 365/171
(58) Field of Classification Search ...................... 438/3; 365/171
See application file for complete search history.

(56) References Cited

U.S. PATENT DOCUMENTS

| | | | | |
|---|---|---|---|---|
| 5,963,467 A | * | 10/1999 | Miyatake et al. | ............ 365/149 |
| 6,178,108 B1 | * | 1/2001 | Miyatake et al. | ............ 365/149 |
| 6,870,718 B1 | * | 3/2005 | Takahashi et al. | ........ 360/327.3 |
| 6,947,316 B1 | * | 9/2005 | Takahashi et al. | ........... 365/158 |

\* cited by examiner

*Primary Examiner*—Thao P. Le
(74) *Attorney, Agent, or Firm*—Sonnenschein Nath & Rosenthal LLP (57) ABSTRACT

A method of preparing a ring-formed body comprises the steps of: forming, on a substrate, a column in a columnar form which serves as a core of a ring-formed body; depositing, on both the substrate and the column, a ring-formed body forming film for forming the ring-formed body so that the ring-formed body forming film formed on the substrate and that formed on the column are separated from each other; forming a mask film for covering the ring-formed body forming film; and subjecting the mask film and ring-formed body forming film to anisotropic dry etching so that the films remain on a sidewall of the column, forming a ring-formed body comprised of the ring-formed body forming film having the mask film.

3 Claims, 10 Drawing Sheets

METHOD FOR PREPARING A
RING-FORMED BODY, AND MAGNETIC
MEMORY DEVICE AND METHOD FOR
MANUFACTURING THE SAME

CROSS REFERENCE TO RELATED APPLICATION

This application claims priority from Japanese Priority Document No. 2003-048614, filed on Feb. 26, 2003 with the Japanese Patent Office, which document is hereby incorporated by reference.

BACKGROUND OF THE INVENTION

1. Field of the Invention

The present invention relates to a method for preparing a ring-formed body, and a magnetic memory device and a method for manufacturing the same. More particularly, the present invention is concerned with a method for preparing a ring-formed body used for forming a ring-formed magnetic memory element, a magnetic memory device comprising a magnetic memory element comprised of the ring-formed body, and a method for manufacturing the magnetic memory device.

2. Description of Related Art

A magnetic memory device, such as a magnetoresistance effect type random access memory (MRAM), stores information ("0" or "1") in a memory element utilizing the direction of magnetization of a very small memory cell formed from a magnetic film. As the memory cell, those having various forms including a rectangular form, an elliptic form, a circular disk form, and a ring form have been proposed.

For improving the memory capacity, that is, memory cell density per unit area, as the memory cell becomes even smaller, it is necessary that the gap between the memory cells be narrower. However, when the distance between the memory cells is smaller, a problem arises in that magnetic field leakage occurs from the memory cell comprised of a magnetic material to the adjacent memory cell. Therefore, for increasing the capacity of the magnetic memory device, magnetic field leakage from the memory cell must be reduced.

It is easily understood that a memory cell in a ring body is effective for solving the above problem. The reason for this resides in that the magnetic flux caused by magnetization becomes a reflux magnetic flux and hence does not leak. In addition, when whole of the element (comprised of a variety of magnetic films and non-magnetic multilayer films) including memory cells has a ring form, there is an advantage in that magnetic field leakage does not occur from a magnetic film for reference of the direction of magnetization arranged near the memory cell.

Therefore, a magnetic memory device using a ring-formed memory cell has been proposed (see, for example, Non-patent document 1 and Patent document 1), and an attempt to prepare a very small ring-formed magnetic film is actually made. In the ring-formed memory cell, data is recorded in the form of "0" or "1" depending on the direction of magnetization in the circumferential direction, namely, clockwise or counterclockwise direction.

For realizing a future magnetic memory device having a large capacity, the ring-formed body is required to have an inner diameter and a width, both of which are of a submicron size or less. Further, for suppressing dispersion of the inversion of magnetic field caused in the memory cells, the memory cells must have a consistent form. However, it is difficult to produce with high accuracy and high reproducibility a ring-formed film which is of a size in the order of submicron and very thin, and one which can be practically used has not yet been produced.

On the other hand, in the method for preparing a ring-formed magnetic film recently reported by Nakatani et al. (see, for example, Non-patent document 2), while rotating a substrate, a film is deposited by ion beam sputtering at an oblique direction on the inner wall of a fine hole which is formed in a resist film by electron beam lithography. The resultant ring has an outer diameter of 0.5 μm and a ring width of 0.1 μm, and relatively uniform, very small rings are formed with high reproducibility. In addition, it has been confirmed by magnetic force microscopy (MFM) that the ring has properties as a ring-formed magnetic film.

[Patent Document 1]
U.S. Pat. No. 6,351,410 (FIGS. 4 to 6 appearing at pages 5 to 6)

[Non-patent Document 1]
Jian-Gang Zhu and Youfeng Zheng, "Ultrahigh density vertical magnetoresistive random access memory (invited)", Journal of Applied Physics, vol. 87, No. 9, May 1, 2000, p. 6,668–6,673

[Non-patent Document 2]
Ryouichi Nakatani, Noritsugu Takahashi, Hana Asoh, Yoshio Kawamura and Masahiko Yamamoto, "Fabrication of Ring Dot Arrays as a Candidate of Memory Cells", Proceedings of ICMFS 2002 in Kyoto, 2002, p. 178–179

However, in the method for preparing a ring-formed magnetic film recently reported by Nakatani et al., a film is deposited utilizing the shade of the wall of the hole, and therefore diffraction of the flying sputtering particles inevitably occurs to cause a thin film to be deposited on the inside of the ring. In addition, the film is deposited on the inner wall of the hole and therefore, when a multilayer film is formed, the interface between films cannot be parallel to the substrate, thus causing mixing in the side of the multilayer film. For this reason, this method is limited to formation of a ring comprised of a single layer film. Further, in this method, control of the height (thickness) of the ring is difficult and therefore, it is difficult to form with high accuracy a ring-formed body having a thickness in the order of several nm which is required from a practical point of view when the ring-formed body is applied to a magnetic memory device.

A method in which a multilayer film in a circular form is formed by a conventional lithography technique and then a hole is formed in the center portion of the multilayer film to form a ring is theoretically possible. However, positioning for forming a hole in the center portion of a number of very small circular disks is extremely difficult and is not practical.

SUMMARY OF THE INVENTION

The present invention has been made for solving the above problems and is directed to a method for preparing a ring-formed body, and a magnetic memory device and a method for manufacturing the same.

The method for preparing a ring-formed body of the present invention comprises the steps of; forming, on a substrate, a column in a columnar form which serves as a core of a ring-formed body; depositing, on both the substrate and the column, a ring-formed body forming film for forming the ring-formed body so that the ring-formed body forming film formed on the substrate and the ring-formed body forming film formed on the column are separated from each other; forming a mask film for covering the ring-formed body forming film; and subjecting the mask film and the ring-formed body forming film to anisotropic processing so that the films remain on a sidewall of the column, thereby forming a ring-formed body comprised of the ring-formed body forming film having thereon the mask film.

In the method for preparing a ring-formed body, the ring-formed body forming film is deposited using the column as a core, and the mask film for covering the ring-formed body forming film is formed and then the mask film and the ring-formed body forming film are subjected to anisotropic processing, and hence the ring-formed body is formed by so-called self-coordination. Therefore, a very small ring-formed body having a submicron size (diameter) or less and having a thickness in the order of nm to Å can be formed with high accuracy and high reproducibility. The column is formed and then the ring-formed body forming film is deposited on the periphery of the column, and therefore an unnecessary film is not deposited on the inside of the ring-formed body.

The ring-formed body forming film can be formed from a plurality of thin films, and therefore can be formed by depositing and stacking thin films comprising a magnetic film. In addition, the column is formed so that the vertical cross-section with respect to the surface of the substrate is in a trapezoid form, that is, the sides of the column are comprised of slanting planes. Therefore, the interfaces between the individual thin films constituting the ring-formed body can be not only so-called steep in both the form and the composition but also parallel to one another. Further, no mixing occurs in the side portion of the multilayer film (on the side of the column). Therefore, by using the ring-formed body comprised of a multilayer film, various types of functional devices, for example, magnetic memory element can be produced.

By appropriately changing the form of the column, the inner and outer diameters and thickness of the ring-formed body can be controlled arbitrarily with high accuracy. Therefore, the ring-formed body formed can have a consistent size.

When the conductive material in a columnar form and the nonmagnetic material film formed on the sidewall of the conductive material constitute the column, the ring-formed body having the conductive material extending along the center portion can be formed. When the ring-formed body having the conductive material (e.g., current line) extending along the center portion is formed from a multilayer film comprising a magnetic layer and used as a memory cell, a current is allowed to flow the conductive material to generate a current magnetic field in the circumferential direction of the ring-formed body, enabling inversion of magnetization of the memory cell. The conductive material extends along the center of the ring-formed body and the ring-formed body is formed to be extremely close to the periphery of the conductive material, and therefore the current magnetic field having a high intensity in the circumferential direction can be efficiently utilized. Further, the ring-formed body itself serves as a magnetic shield, and hence there is an advantage in that the effect of magnetic field leakage on the adjacent element can be removed.

The magnetic memory device of the present invention comprises: a magnetic memory element which stores data utilizing spin momentum transfer switching and which is formed in a ring-form; an electrode connected to a readout element for reading data stored in said magnetic memory element; and a bit line extending along an upper portion of the electrode, wherein the magnetic memory element has a stacked structure comprising a magnetic layer, a nonmagnetic layer, and a magnetic layer, and is connected to both the electrode and the bit line.

In the magnetic memory device, inversion of the direction of magnetization of one magnetic layer as a free layer can be achieved merely by means of a current without a magnetic field. Therefore, the magnetic memory device can be applied to writing on the memory layer in a magnetic memory, such as an MRAM. In addition, when putting the magnetic memory device of the present invention into practical use, for meeting the demands of the memory cell having a single magnetic domain and lowering of the current at inversion, the cell size can be as small as about 200 nm or less, so that the demands of an increase of the memory capacity can be satisfied. Further, the smaller the memory cell, the smaller the current required for the inversion. Therefore, readout and writing can be achieved only by a sense current. For example, readout can be performed by a small current and writing can be performed by a large current. Further, there is no semi-selection state in the current magnetic field writing, and therefore the magnetic memory device is thermally stable. In other words, the magnetic memory device has an advantage in that the resistance to thermal fluctuation is high. In addition, the structure of the memory element is considerably simplified, and a word line for writing needed in a conventional MRAM is not required and a by-pass line is not needed, and further the memory element can be arranged immediately above, for example, an FET which serves as an element for selection. Accordingly, the magnetic memory device is advantageously used as a constituent of a large scale integrated circuit.

The method for manufacturing a magnetic memory device of the present invention comprises the steps of: forming an electrode connected to an element for selection formed on a semiconductor substrate; forming a ring-formed magnetic memory element which is connected to the electrode and which stores data utilizing spin momentum transfer switching; and forming a bit line connected to the magnetic memory element. The step of forming the ring-formed magnetic memory element comprises the steps of: forming, on the electrode, a column comprised of a nonmagnetic insulating material in a columnar form, which serves as a core of a ring-formed body; forming, on both the electrode and the column, a magnetic memory element forming film for forming the magnetic memory element so that the magnetic memory element forming film formed on the electrode and the magnetic memory element forming film formed on the column are separated from each other; forming a mask film for covering the magnetic memory element forming film; and subjecting the mask film and the magnetic memory element forming film to anisotropic processing so that the films remain on a sidewall of the column, thereby forming a ring-formed magnetic memory element comprised of the magnetic memory element forming film having thereon the mask film.

By the method for manufacturing a magnetic memory device, the magnetic memory device of the present invention can be easily produced. Specifically, the ring-formed magnetic memory element is formed employing the method for preparing a ring-formed body of the present invention, and therefore the ring-formed magnetic memory element can be easily produced from a ring-formed stacked film comprising a magnetic layer, a nonmagnetic layer, and a magnetic layer with high accuracy and high reproducibility.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which:

FIGS. 1A to 1H are diagrammatic views illustrating the steps in a method for preparing a ring-formed body according to the first embodiment of the present invention;

FIGS. 8A and 8B are views showing an example in which the construction of a ring-formed body obtained in the third and forth embodiments is applied to an MRAM, wherein

FIGS. 10A and 10B are views showing a magnetic memory device according to one embodiment of the present invention, wherein

DESCRIPTION OF THE PREFERRED EMBODIMENTS

The method for preparing a ring-formed body according to the first embodiment of the present invention will be described with reference to the diagrammatic views of steps of FIGS. 1A to 2E. The method for preparing a ring-formed body of the present invention for a ring-formed body comprised of a single layer film is similar to that for a ring-formed body comprised of the below-described multilayer film. Therefore, FIGS. 1A to 1H illustrate a method for the ring-formed body comprised of a single layer film, and the method for preparing a ring-formed body comprised of a single layer film is described below. FIGS. 2A to 2E illustrate a method for producing a column.

Figure 1A:
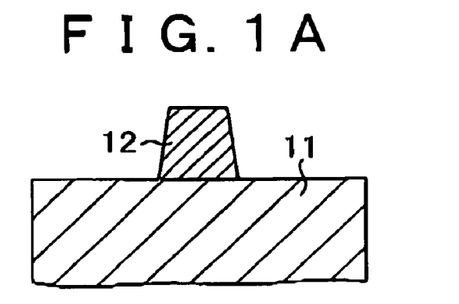

As shown in FIG. 1A, on a substrate 11, a column 12 in a columnar form which serves as a core of a ring-formed body is formed.

The method for preparing the column 12 is described with reference to FIGS. 2A to 2E. The values used in the description below are merely examples when forming the column for the purpose of forming a ring-formed body having an outer diameter of 0.2 μm, an inner diameter of 0.1 μm, and a film thickness of 3 nm, and they may be appropriately changed depending on the ring-formed body to be formed.

Figure 2A:
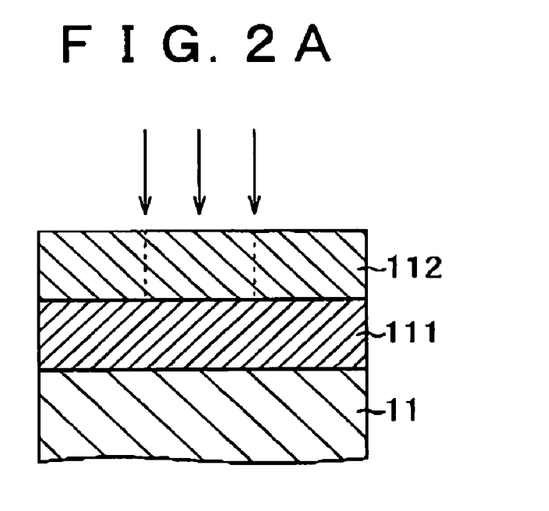
FIGS. 2A to 2E are diagrammatic views illustrating the steps in the method for preparing a ring-formed body according to the first embodiment of the present invention.

As shown in FIG. 2A, a hard mask film 111 which serves as a core of a ring-formed body and a resist film 112 for lithography are formed on the substrate 11 by, for example, application. On the substrate 11, an arbitrary pattern (e.g., field effect transistor circuit) comprised of a plurality of films may be formed. The hard mask film 111 and resist film 112 individually have a thickness of about 200 nm. When each film has too large a thickness, it is difficult to form a fine mask pattern (column). Various types of materials can be used in the hard mask film 111, but silicon oxide ($SiO_2$) suitable for reactive ion etching is used in the present embodiment, As the resist film 112, a resist film for electron beam lithography is used. The resist for electron beam lithography used is of a negative type such that the portion irradiated with an electron beam has a resistance to a developer. An electron beam resist of a positive type can be used. It is preferred that, prior to formation of the hard mask film 111, a primary film (not shown) is formed on the substrate 11. For example, when a thermal silicon oxide substrate is used as the substrate 11, it is preferred that, prior to deposition of a silicon oxide ($SiO_2$) film, a primary film of tantalum (Ta), chromium (Cr), or titanium (Ti) is formed to improve the bonding strength of the film.

Figure 2B:
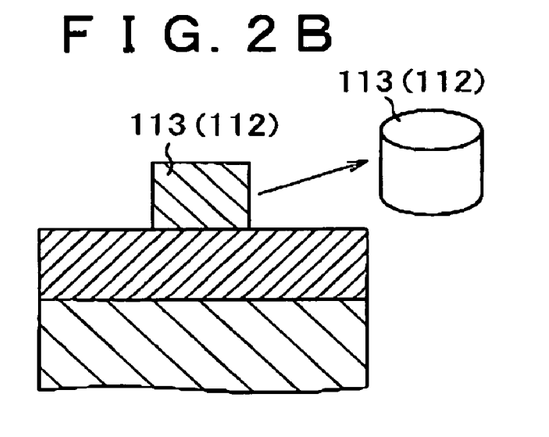

Next, the resist film 112 is irradiated with an electron beam (EB) in a circular form (electron beam exposure), and the portion of the resist film 112 irradiated with an electron beam is removed by development to form a fine resist column 113 comprised of the resist film 112 shown in FIG. 2B. The diameter of the resist column 113 is controlled by adjusting the conditions for electron beam radiation and the pattern size. For example, the resist column 113 comprised of the resist film 112 having a diameter of about 50 to 100 nm can be formed by adjusting the current to be in the order of $10^{-11}$ A at H=50 kV.

Figure 2C:
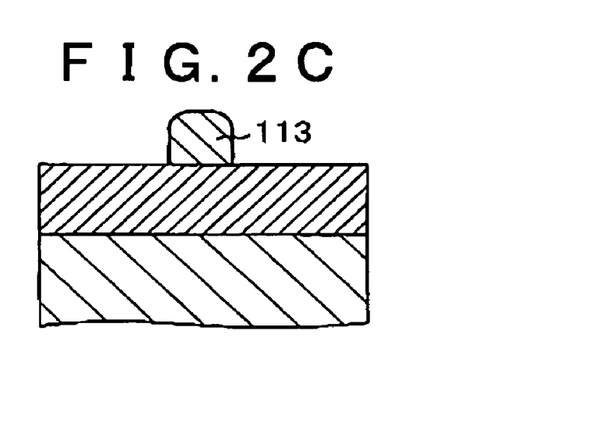

When the diameter of the resist column 113 is further reduced, as shown in FIG. 2C, the surface of the resist column 113 can be removed by ashing using an appropriate isotropic oxygen plasma.

Figure 2D:
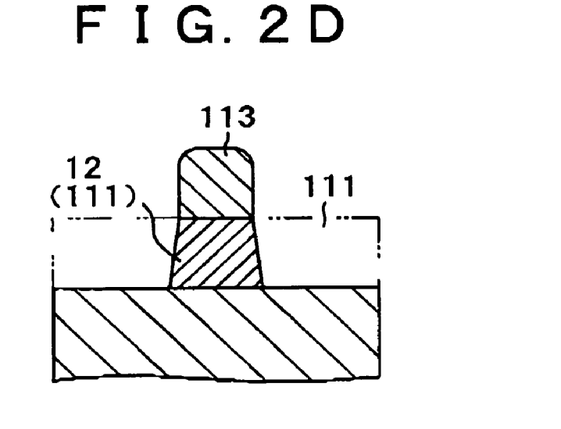

Next, as shown in FIG. 2D, using the resist column 113 as a mask, the portion of the hard mask film 111 indicated by a two-dot-dash line in the figure is subjected to anisotropic processing, for example, anisotropic dry etching to form a column 12 comprised of a silicon oxide ($SiO_2$) film, which serves as a core of a ring-formed body, so that the vertical cross-section of the column 12 with respect to the surface of the substrate 11 is in a trapezoid form. For example, the column formed has a vertical cross-section in a cone trapezoid form or a pyramid trapezoid form. In the anisotropic processing, it is effective to use reactive ion etching (hereinafter, frequently referred to simply as "RIE") using, e.g., tetrafluoromethane ($CF_4$) gas as an etching gas or ion milling. It is important for the anisotropic processing not to vertically cut the hard mask film 111 but to process the hard mask film 111 into a cone trapezoid form or pyramid trapezoid form for the purpose described below. In the RIE using $CF_4$ gas, tapering of the sidewall of the column can be controlled by changing the degree of anisotropy by adjusting the gas pressure or the like. In the ion milling, the tapering can be controlled by conducting etching while appropriately inclining the substrate with respect to an ion beam. In the present embodiment, an angle between the sidewall of the column and the surface of the substrate 11 is 60 to 70°.

Figure 2E:
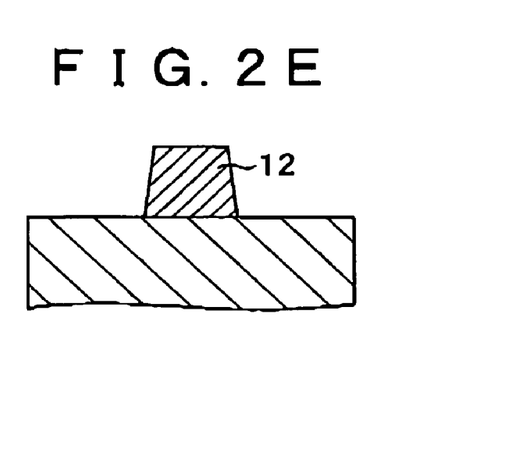

Then, as shown in FIG. 2E, the resist column 113 (see FIG. 2D) is removed by a resist removing process, thus completing preparation of the column 12 comprised of a silicon oxide film.

Figure 1B:
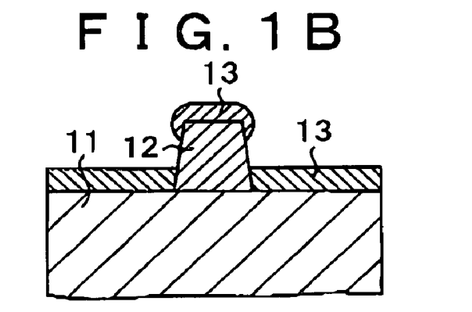

Next, as shown in FIG. 1B, a ring-formed body-forming film 13 for forming a ring-formed body is formed on both the substrate 11 and the column 12 so that the ring-formed body forming film 13 formed on the substrate 11 and the ring-formed body forming film 13 formed on the column 12 are separated from each other. The ring-formed body forming film 13 may be of ether a single layer film or a multilayer film. In the present embodiment, as a single layer film, for example, a Permalloy film (e.g., $Ni_{80}Ni_{20}$) having a thickness of 3 nm is deposited.

As suggested in the above description made with reference to FIG. 2D, the reason why the column 12 comprised of a silicon oxide film is formed so that the sides of the column are comprised of slanting planes, for example, the column is formed into a cone trapezoid form or a pyramid trapezoid form is described with reference to FIGS. 3A and 3B.

Figure 3A:
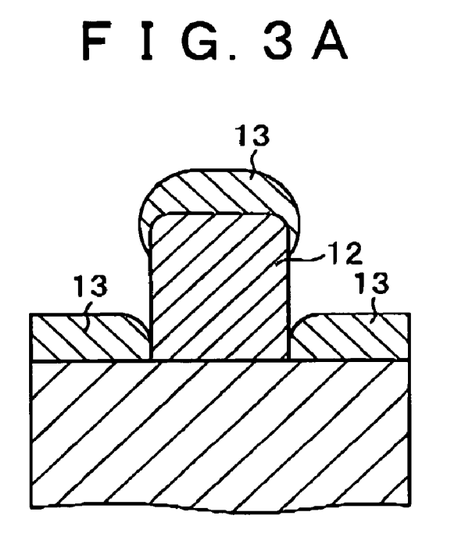
FIGS. 3A and 3B are diagrammatic cross-sectional views for explaining the reason why the sides of a column are comprised of slanting planes.
Figure 3B:
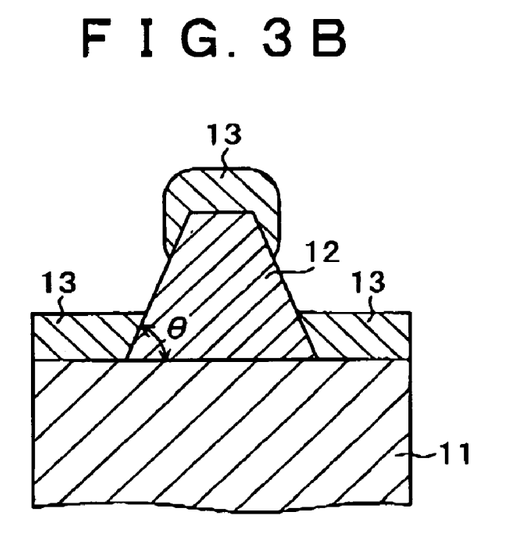

As shown in FIG. 3A, when the column 12 has a form such that the sides are vertical, the ring-formed body forming film 13 surrounding the column 12 sinks, so that the portion of the ring-formed body forming film 13 surrounding the column 12 to be used as a ring-formed body has a defect or has no inherent function. On the other hand, as shown in FIG. 3B, when the column 12 is formed so that the sides are comprised of slanting planes, for example, the column has a cone trapezoid form or a pyramid trapezoid form, the column 12 does not inhibit deposition of the ring-formed body forming film 13, thus enabling the ring-formed body forming film 13 deposited on the periphery of the column 12 to be flat. It is preferred that an angle θ between the sidewall of the column 12 and the surface of the substrate 11 is 60 to 70°. When the angle θ is less than 60°, the ring-formed body forming film 13 is disadvantageously deposited on the sidewall of the column 12. On the other hand, when the angle θ is more than 70°, like in the case where the column 12 has a form such that the sides are vertical, the ring-formed body forming film 13 surrounding the column 12 sinks, so that the portion of the ring-formed body forming film 13 surrounding the column 12 to be used as a ring-formed body disadvantageously has a defect or has no inherent function.

Figure 1C:
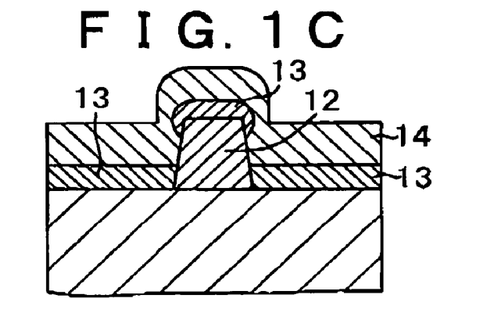

Next, as shown in FIG. 1C, a mask film 14 for covering the ring-formed body forming film 13 is formed. As the mask film 14, for example, a silicon oxide (SP-$SiO_2$) film deposited by sputtering or an aluminum oxide (SP-$Al_2O_3$) film deposited by sputtering, or a CVD film, such as silicon nitride (P-SiN) deposited by a plasma CVD process, silicon oxide (P-SiO) deposited by a plasma CVD process, or silicon oxide (P-TEOS) deposited by a plasma TEOS-CVD process, can be used. An organic film having a high heat resistance, such as polyimide, can be used. The CVD film requires heating at about 350 to 400° C. after the deposition, and therefore the use of the CVD film may be selected depending on the heat resistance of the ring-formed body forming film 13. In any methods for the deposition, it is necessary that the side of the column 12 be entirely covered (coverage be excellent).

Figure 1D:
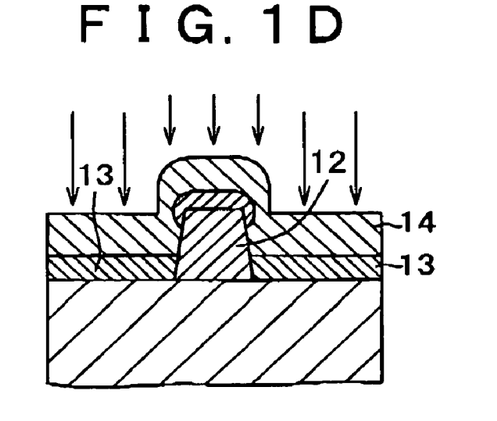

Then, as shown in FIG. 1D, the mask film 14 and the ring-formed body forming film 13 are subjected to anisotropic processing. The anisotropic processing (e.g., anisotropic dry etching or ion milling) removes the excess ring-formed body forming film 13 and mask film 14 other than the ring-formed body forming film 13 and mask film 14 formed on the side portion of the column 12.

Figure 1E:
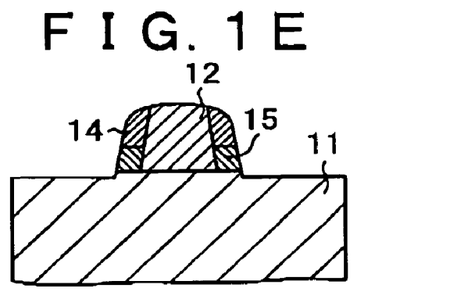

Thus, as shown in FIG. 1E, the ring-formed body forming film 13 and the mask film 14 remain on the sidewall of the column 12 to form a ring-formed body 15 comprised of the ring-formed body forming film 13 having the mask film 14 thereon. The width of the ring-formed body 15 is substantially determined by the thickness of the mask film 14 (accurately, the thickness of the mask film 14 remaining on the side portion of the column), the etching time, and the anisotropy of etching. The etching depth for the substrate 11 is appropriately determined depending on the purpose. The mask film 14 may be removed after forming the ring-formed body 15.

Figure 1F:
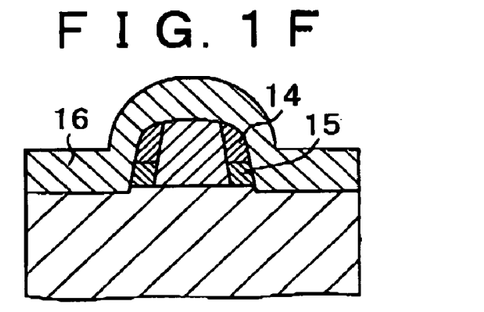

Next, as shown in FIG. 1F, an insulating film 16 is formed on the entire surface of the substrate 11 so that the column 12, the mask film 14, and the ring-formed body 15 are embedded in the insulating film 16. The insulating film 16 is formed from, for example, an SP-$SiO_2$ film or an SP-$Al_2O_3$ film.

Then, as shown in FIG. 1G, the portion of the insulating film 16, column 12, and mask film 14 indicated by two-dot-dash lines in the figure is removed by, for example, etchback using reactive ion etching or by chemical mechanical polishing (CMP) to planarize the surface of the insulating film 16 and to expose the upper surface of the ring-formed body 15.

Figure 1H:
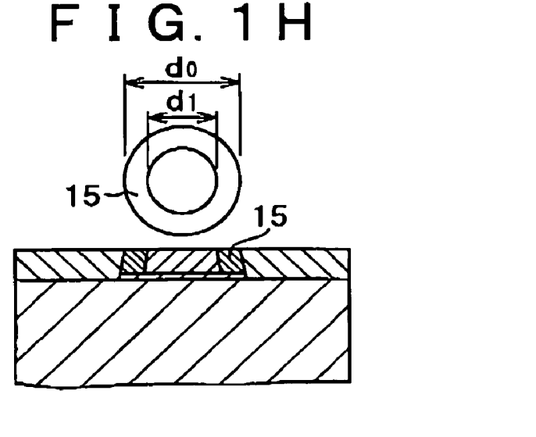

Thus, preparation of the very small ring-formed body 15 shown in FIG. 1H is completed. The ring-formed body 15 has an inner diameter di of, for example, 0.2 μm and an outer diameter do of, for example, 0.3 μm, and has a dispersion of the inner diameter and the outer diameter of about 10%. The accuracy of control of the film thickness is equivalent to the accuracy of the film thickness in conventional methods for forming various thin films, and the control with an accuracy in the order of Å is possible. Subsequently, an electrode film is deposited and appropriately patterned to produce an element.

Next, the method for preparing a ring-formed body according to the second embodiment of the present invention will be described with reference to the diagrammatic cross-sectional view of FIG. 4. The method for preparing a ring-formed body of the present invention is for a ring-formed body comprised of a multilayer film.

The steps for forming a ring-formed body comprised of a multilayer film are basically the same as the steps in the first embodiment. The step in which the ring-formed body forming film 13 is formed from a multilayer film is different from the first embodiment.

In the present embodiment, as the ring-formed body forming film 13 which is advantageously used in, for example, a magnetic random access memory (hereinafter, frequently referred to simply as "MRAM"), a multilayer film having a magnetic tunnel junction (hereinafter, frequently referred to simply as "MTJ") which exhibits a tunnel magnetoresistance (hereinafter, frequently referred to simply as "TMR") effect is used. The multilayer film has, as an example, a stacked structure comprising primary film/electrode film (e.g., Cu)/primary film/antiferromagnetic film/reference layer magnetic film/insulating film (e.g., $Al_2O_3$)/memory layer magnetic film/cap film in this order from the lower layer.

Figure 4:
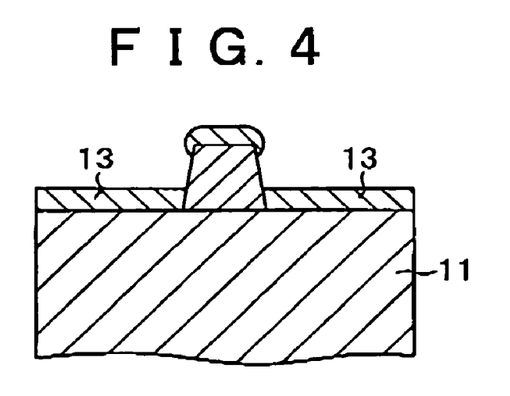
FIG. 4 is a diagrammatic cross-sectional view showing the construction of a method for preparing a ring-formed body according to the second embodiment of the present invention.

As shown in FIG. 4, in the second embodiment, a multilayer film constituting the ring-formed body forming film 13 can be stacked in parallel to the surface of the substrate 11, and therefore, when the multilayer film is formed on the ring-formed body 15 {see FIG. 1E}, the state is maintained and the interfaces between the individual thin films constituting the multilayer film are steep and parallel to one another. Therefore, quantum theory effects at the interface, such as spin dependence scattering of the conducting electrons, can be effectively utilized. Further, no mixing occurs between the individual thin films in the side portion of the ring-formed body forming film 13, and therefore the multilayer film formed on the very small ring-formed body 15 can exhibit a function as a functional multilayer film.

Therefore, an electrode (not shown) is disposed on the upper portion of the ring-formed body 15 comprised of a multilayer film which is obtained by processing the ring-formed body forming film 13, and a voltage is applied between the electrode disposed and a not shown electrode formed on the substrate 11 to allow a current to flow in the direction perpendicular to the surface of the multilayer film, so that a current magnetic field in the circumferential direction is generated to cause inversion of the magnetization of the memory layer magnetic film.

Next, the method for preparing a ring-formed body according to the third embodiment of the present invention will be described with reference to the diagrammatic views of steps of FIGS. 5A to 5G. The method for preparing a ring-formed body of the present invention is a method for the case where a conductive material is formed in the center of the ring-formed body.

The present third embodiment is basically the same as the first embodiment. The method for forming the column 12 is different from that in the first embodiment, The method for forming the column 12 is mainly described below.

Figure 5A:
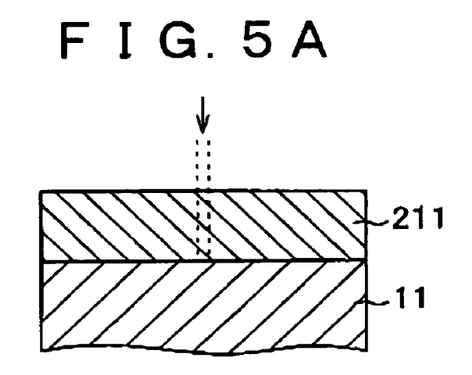
FIG. 5A to 5G are diagrammatic views illustrating the steps in a method for preparing a ring-formed body according to the third embodiment of the present invention.
Figure 5B:
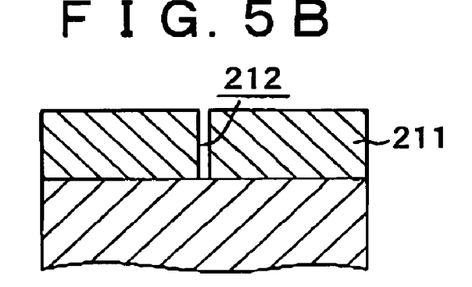

As shown in FIG. 5A, on a substrate 11 having an arbitrary circuit formed thereon, a resist film 211 for lithography is formed by, for example, application. The resist film 211 has a thickness of, for example, 100 to 200 nm. As the resist film 211, a resist film for electron beam lithography is used. The resist for electron beam lithography used is of a positive type such that the portion irradiated with an electron beam is dissolved in a developer. An electron beam resist of a negative type can be used. Then, the resist film 211 is irradiated with an electron beam (EB) (electron beam exposure) in a region corresponding to the size of a conductor line to be formed, for example, a diameter of about 20 to 100 nm. Then, the portion of the resist film 211 irradiated with an electron beam is removed by development to form a fine hole 212 comprised of the resist film 211 shown in FIG. 5B. The diameter of the hole 212 is controlled by adjusting the conditions for electron beam radiation and the pattern size. In the present embodiment, the hole 212 having a diameter of about 50 to 100 nm is formed.

Figure 5C:
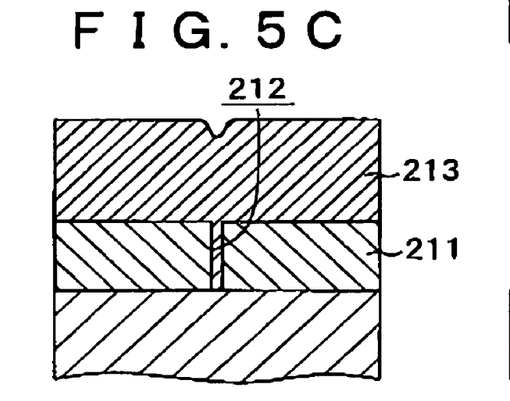

Next, as shown in FIG. 5C, a conductive film 213 is formed from a wiring material on the resist film 211 so as to fill the hole 212. As the wiring material, a wiring material used in a semiconductor device, for example, copper, a copper alloy, tungsten, or aluminum can be used. In deposition of the film, for example, when using copper, the film is deposited by sputtering and plating. When using tungsten, the film is deposited by sputtering.

Figure 5D:
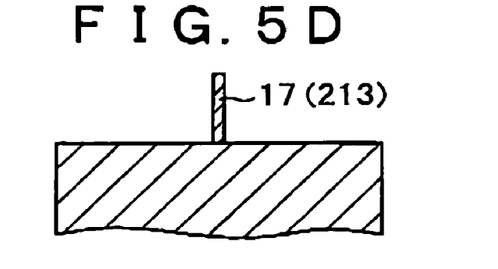

Then, the resist film 211 and the conductive film 213 deposited on the resist film 211 are removed by a lift-off method to obtain a conductive material 17 in a columnar form comprised of the conductive film 213 shown in FIG. 5D. The conductive material 17 has a function of core line later. The lift-off properties can be improved by removing the conductive film 213 by chemical mechanical polishing (CMP) before the lift-off method.

Figure 5E:
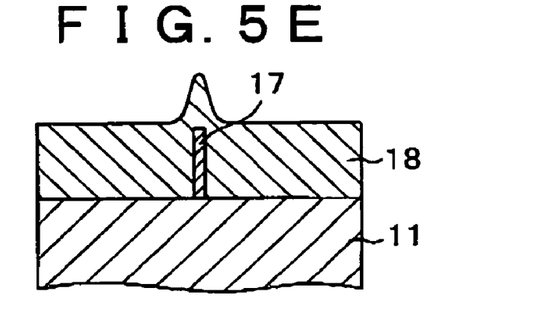

Next, as shown in FIG. 5E, a nonmagnetic material film 18, which serves as part of the column when forming a ring-formed body, is deposited from, for example, an insulating film on the substrate 11 so that the conductive material 17 is embedded in the nonmagnetic material film 18. Therefore, the nonmagnetic material film 18 is higher than the conductive material 17.

Figure 5F:
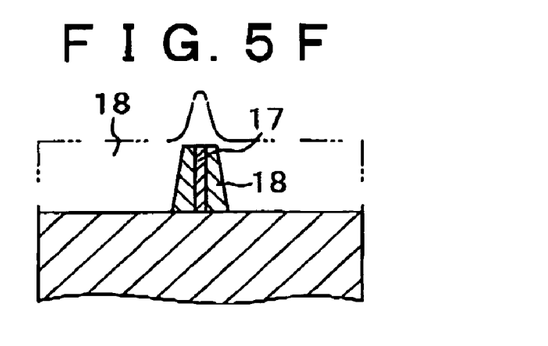
Figure 5G:
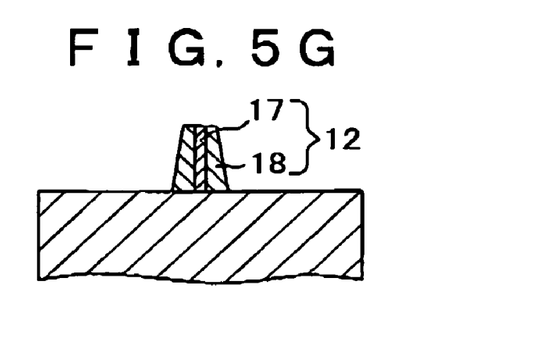

Next, as shown in FIG. 5F, the nonmagnetic material film 18 (portion indicated by a two-dot-dash line in the figure) is subjected to anisotropic processing (e.g., anisotropic dry etching or ion milling) so that the nonmagnetic material film 18 remains only on whole of the side portion of the conductive material 17. Thus, preparation of a column 12 shown in FIG. 5G, in which the nonmagnetic material film 18 is formed on whole of the side of the conductive material 17 which serves as a core line, is completed.

Then, a ring-formed body is formed using the column 12 in the same manner as that described in the first embodiment. Specifically, the steps subsequent to the step of FIG. 1B in the first embodiment are conducted.

Figure 6:
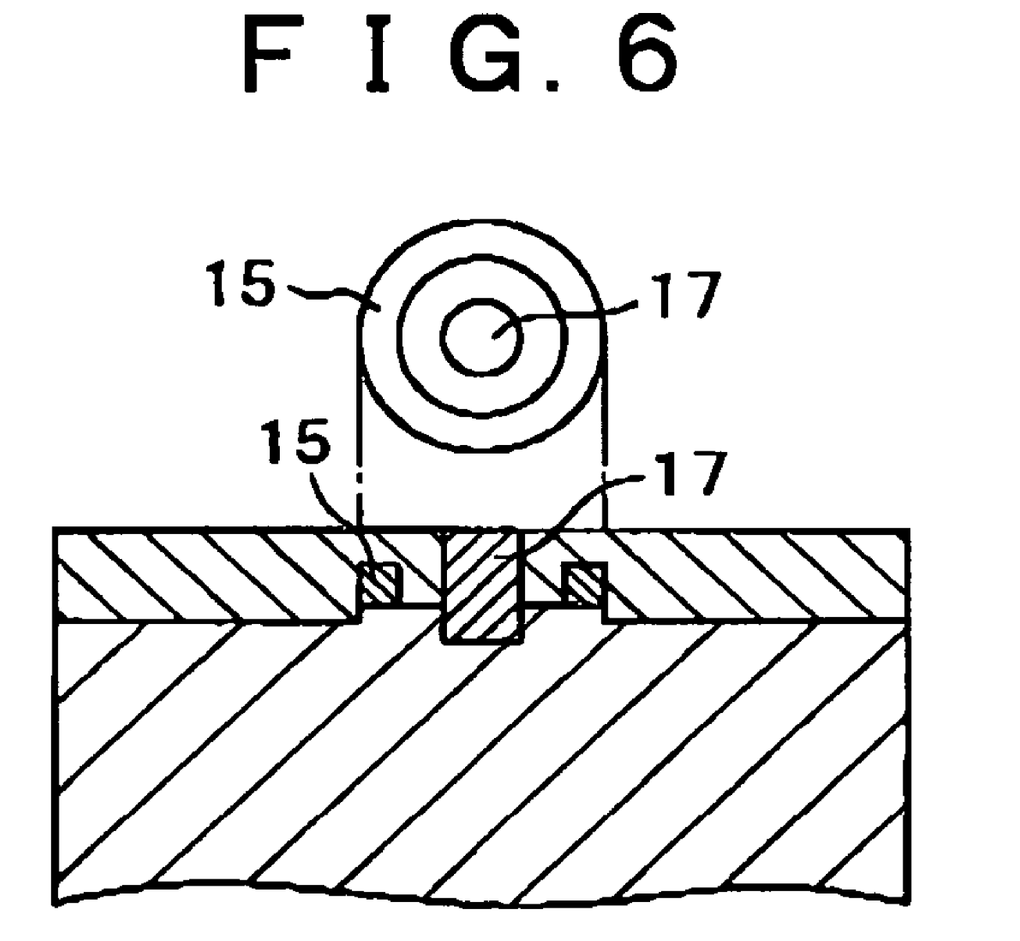
FIG. 6 is a diagrammatic cross-sectional view showing the construction and layout for explaining one example in which a conductive material is formed in the center of a ring-formed body.

Thus, a ring-formed body 15 shown in FIG. 6 having in its center a copper line comprised of the conductive material 17 wherein the ring-formed body 15 and the conductive material 17 are concentric is formed.

Figure 7A:
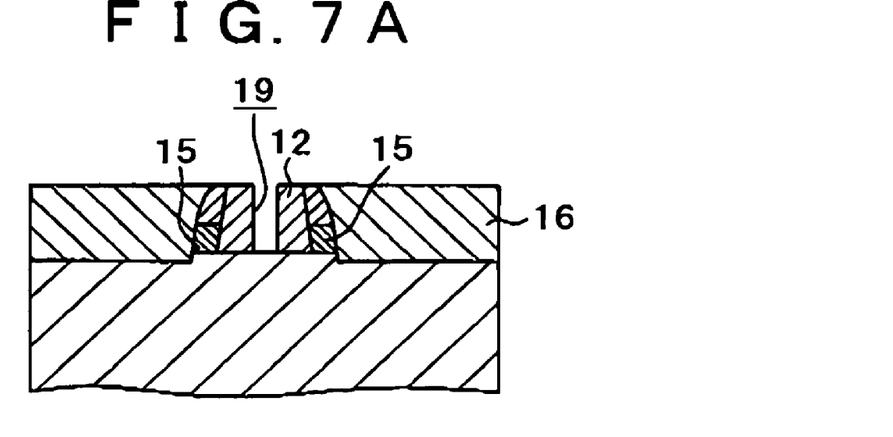
FIGS. 7A to 7C are diagrammatic views illustrating the steps in a method for preparing a ring-formed body according to the forth embodiment of the present invention.
Figure 7B:
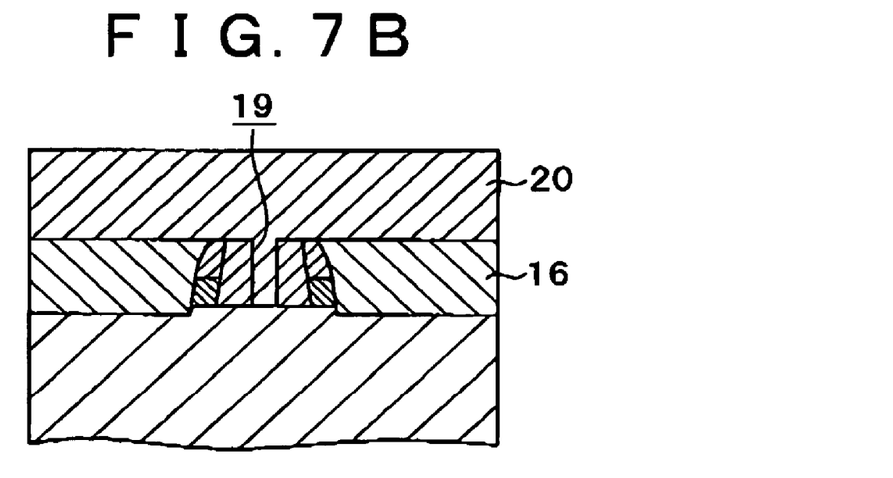
Figure 7C:
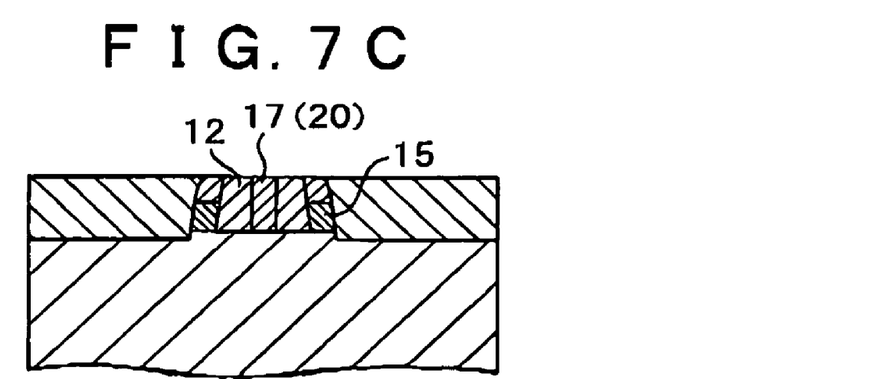

Next, as the method for the case where a conductive material is formed in the center of a ring-formed body, a method different from the method in the third embodiment is described as the forth embodiment with reference to the diagrammatic views of steps of FIGS. 7A to 7C.

As shown in FIG. 7A, in the course of the step for planarization of the insulating film 16 described above with reference to FIG. 1G, a hole 19 is formed in the column 12 comprised of silicon oxide in the ring-formed body 15 by the same method as that for forming a contact hole to a gate electrode in a transistor. Next, as shown in FIG. 7B, the hole 19 is filled with a conductive film 20 which is a wiring material. Then, the conductive film 20, the insulating film 16 and the like are subjected again to planarization by chemical mechanical polishing to obtain a conductive material 17 shown in FIG. 7C comprised of the conductive film 20 in the center axis of the ring-formed body 15. In the present embodiment, an example is shown in which a copper electrode having a diameter of 0.1 µm is formed in the ring-formed body 15 comprised of a multilayer film having an inner diameter of 0.2 µm. The ring-formed body 15 and the conductive material 17 are of a coaxial structure such that they are insulated from each other by the column 12 (insulating film).

In the third and forth embodiments, as the constituent film of the ring-formed body 15, for example, a multilayer film having an MTJ which exhibits a TMR effect described above in the second embodiment can be used.

Using, as a current line, the conductive material 17 in the ring-formed body 15 comprised of the multilayer film having an MTJ which exhibits a TMR effect, a current is allowed to flow the current line to generate a current magnetic field in the circumferential direction of the ring-formed body 15, thus enabling inversion of the direction of magnetization of the memory layer comprised of a ring-formed magnetic film. The conductive material 17 as a current line extends along the center of the ring-formed body 15 and the ring-formed body 15 is arranged so as to be extremely close to the periphery of the conductive material 17, and therefore a current magnetic field having a high intensity in the circumferential direction can be efficiently generated in the ring-formed body 15. The inversion of magnetization caused by the memory cell constituted by the ring-formed body 15 comprised of a multilayer film having an MTJ which exhibits a TMR effect has advantages not only in that the efficiency of utilizing the magnetic field is high, as compared to conventional inversion of magnetization caused by a current magnetic field generated by direct currents flowing current lines arranged to cross above and under the memory cell, but also in that the ring-formed body 15 itself serves as a magnetic shield.

In addition, by subjecting the multilayer film having an MTJ described above in the second embodiment to annealing at an appropriate temperature in a state such that a magnetic field in the circumferential direction is generated by the current line formed in the ring-formed body 15, exchange coupling can be induced in the (antiferromagnetic layer)/(ferromagnetic film for reference of magnetization) interface in the ring-formed body 15 to fix the direction of magnetization of the reference layer. In this case, the annealing temperature is the blocking temperature of the antiferromagnetic layer/reference layer or higher, the Neel temperature of the antiferromagnetic layer or higher, or the ordering temperature or higher when the antiferromagnetic layer is an ordered phase.

In the methods for preparing a ring-formed body according to the first to forth embodiments, the ring-formed body forming film 13 is deposited using the column 12 as a core, and the mask film 14 for covering the ring-formed body forming film 13 is formed and then the mask film 14 and the ring-formed body forming film 13 are subjected to anisotropic processing, and hence the ring-formed body 15 is formed by so-called self-coordination. Therefore, a very small ring-formed body 15 having a submicron size (diameter) or less and having a thickness in the order of nm to Å can be formed with high accuracy and high reproducibility. The column 12 is formed and then the ring-formed body forming film 13 is deposited on the periphery of the column 12, and therefore an unnecessary film is not deposited on the inside of the ring-formed body 15.

By appropriately changing the form of the column 12, the inner and outer diameters and thickness of the ring-formed body 15 can be controlled arbitrarily with high accuracy. Therefore, the ring-formed body 15 formed can have a consistent size.

In the method in which the ring-formed body forming film 13 is formed from a plurality of thin films, the ring-formed body can be formed by depositing and stacking thin films comprising a magnetic film. In addition, the column 12 is formed so that the vertical cross-section with respect to the surface of the substrate 11 is in a trapezoid form, that is, the sides of the column 12 are comprised of slanting planes. Therefore, the interfaces between the individual thin films constituting the ring-formed body 15 can be not only so-called steep in both the form and the composition but also parallel to one another. Further, no mixing occurs in the side portion of the multilayer film (on the side of the column). Therefore, by using the ring-formed body comprised of a multilayer film, various types of functional devices, for example, magnetic memory element can be produced.

When the conductive material 17 in a columnar form and the nonmagnetic material film 18 formed on the sidewall of the conductive material 17 constitute the column 12, the ring-formed body 15 having the conductive material 17 extending along the center portion can be formed. When the ring-formed body 15 having the conductive material (e.g., current line) 17 extending along the center portion is formed from a multilayer film comprising a magnetic layer and used as a memory cell, a current is allowed to flow the conductive material 17 to generate a current magnetic field in the circumferential direction of the ring-formed body 15, enabling inversion of magnetization of the memory cell. The conductive material 17 extends along the center of the ring-formed body 15 and the ring-formed body 15 is formed to be extremely close to the periphery of the conductive material 17, and therefore the current magnetic field having a high intensity in the circumferential direction can be efficiently utilized. Further, the ring-formed body 15 itself serves as a magnetic shield, and hence there is an advantage in that the effect of magnetic field leakage on the adjacent element can be removed.

An estimated improvement of the current use efficiency by the conductive material (current line) 17 formed in the center portion of the ring-formed body 15 is about 27%. For example, with respect to the ring-formed body 15 having an outer diameter of 0.6 μm and an inner diameter of 0.2 μm, it has been found that the writing current required at a sense current fixed to 10 mA is 15 mA in a magnetic field from the current lines disposed above and under the ring-formed body 15, whereas, the writing current required is 11 mA in a magnetic field from the conductive material (current line) 17 extending along the center of the ring-formed body 15.

The film to which the method for preparing a ring-formed body of the present invention is applied is not limited to a soft magnetic film. For example, the method can be applied to dielectric films and a variety of functional thin films, and can be applied as various micro devices.

Next, one example of an MTJ film constituting the ring-formed body 15 used in the third and forth embodiments is described below.

The MTJ film constituting the ring-formed body 15 can have a stacked structure comprising a ring-formed first soft magnetic film, a ring-formed insulating film (e.g., aluminum oxide ($Al_2O_3$) film), and a ring-formed second soft magnetic film having a coercive force (Hc) smaller than that of the first soft magnetic film in this order from the lower layer. As the soft magnetic film, for example, Co, Co—Fe, or the like may be used. The difference in coercive force (Hc) between the soft magnetic films can be controlled by changing the material for or thickness of the soft magnetic film (the larger the thickness, the larger the coercive force (Hc)). In this case, data (magnetization in the ring-formed body 15 in the clockwise or counterclockwise direction) is stored in the ring-formed soft magnetic film having a larger coercive force (Hc), and the ring-formed soft magnetic film having a smaller coercive force (Hc) is used for readout of the data.

In the ring-formed body 15 used in the third and forth embodiments, as the memory element, a giant magnetoresistance (hereinafter, frequently referred to simply as "GMR") film which utilizes a GMR effect can be used. The GMR film can have a stacked structure comprising, for example, a ring-formed first soft magnetic film, a ring-formed nonmagnetic metal film (e.g., copper film), and a ring-formed second soft magnetic film having a coercive force (Hc) smaller than that of the first soft magnetic film in this order from the lower layer. Alternatively, the GMR film can be of a multilayer film obtained by staking on one another a plurality of the above stacked films. As the soft magnetic film, for example, Co, Co—Fe, or the like may be used. The difference in coercive force (Hc) between the soft magnetic films can be controlled by changing the material for or thickness of the soft magnetic film {the larger the thickness, the larger the coercive force (Hc)}. In this case, data (magnetization in the ring-formed body 15 in the clockwise or counterclockwise direction) is stored in the ring-formed soft magnetic film having a larger coercive force (Hc), and the ring-formed soft magnetic film having a smaller coercive force (Hc) is used for readout of the data. When the direction of magnetization of one soft magnetic film among the two soft magnetic films is fixed to one circumferential direction by an appropriate method, this film is used as a reference layer and another one soft magnetic film is used as a memory layer. In this case, there is no need to cause a difference in the coercive force (Hc) between the two layers of soft magnetic films.

In the ring-formed memory element, the magnetic field caused by the current line extending through the ring-formed memory element is not always required for inversion of magnetization of the memory layer. By allowing a satisfactorily large current to flow the ring-formed GMR film from the bit line, a magnetic field in the circumferential direction needed for inversion of magnetization can be generated in the ring-formed magnetic film. However, the magnetic field needed for inversion at 180° of the direction of magnetization in the ring-formed body, namely, bit line current is considerably large, and a problem of damage of the memory element or heat generation in the bit line may be encountered. For removing the problem, by adding the magnetic field caused by the current line extending through the ring-formed memory element to the magnetic field caused by the current flowing the ring-formed memory element from the bit line, not only can the current flowing the both lines be suppressed, but also an intense magnetic field in the circumferential direction can be generated in the ring-formed body, thus enabling high speed inversion of magnetization at a lower current density.

Figure 8A:
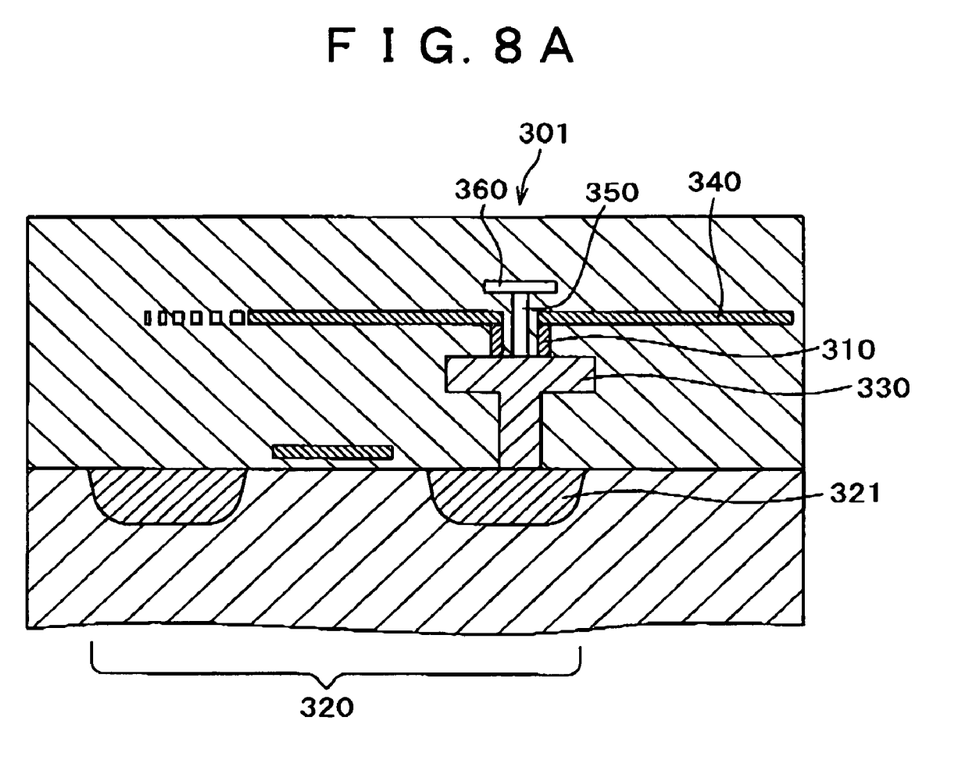
FIG. 8A is a diagrammatic cross-sectional view showing the construction.
Figure 8B:
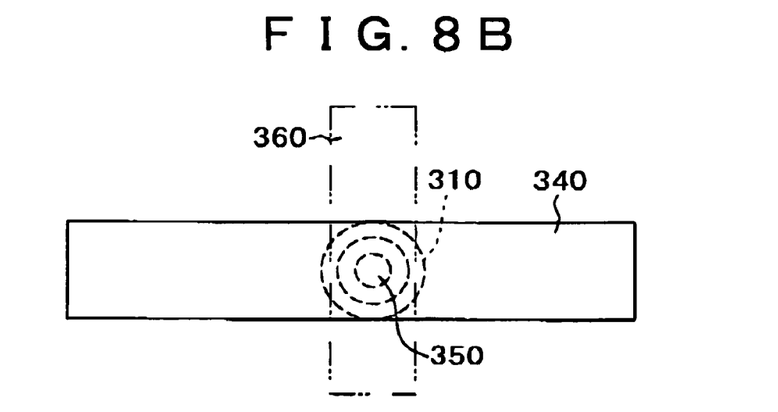
FIG. 8B is a plan layout view of a memory element and wiring.

Next, an example in which the construction of the ring-formed body obtained in the third and forth embodiments is applied to an MRAM will be described with reference to FIGS. 8A and 8B. FIGS. 8A and 8B representatively show one cell in the MRAM, wherein FIG. 8A is a diagrammatic cross-sectional view showing the construction, and FIG. 8B is a plan layout view of a memory element and wiring.

As shown in FIGS. 8A and 8B, an MRAM 301 is of a 1T1J type in which one field effect transistor 320 for switch is provided per one memory cell 310. The memory cell 310 constituted by a ring-formed body comprised of a multilayer film having an MTJ is disposed on a drain 321 of the field effect transistor 320 through an electrode 330. A bit line 340 is provided on the uppermost layer of the memory cell 310, and a conductive material (current line) 350 passing through the memory cell 310 is connected to a word line 360 which spatially crosses the bit line 340 (for example, at a right angle). To one bit line 340 and word line 360 are connected a number of not shown memory cells. The electrode 330 on the drain 321 is a common terminal for both the memory cell 310 constituted by the ring-formed body and the conductive material (current line) 350. The bit line 340 and the word line 360 cross at a right angle in the figure, but there is no particular limitation.

Next, the magnetic memory device of the present invention utilizing spin momentum transfer switching is described.

Inversion of magnetization of a memory cell is currently made by means of a current magnetic field generated when an electric current flows a conductor line. As the capacity of a magnetic memory device is increased, shrinking of the memory cell progresses. In accordance with this tendency, the current amount used for generating a magnetic field required for the inversion of magnetization is increased almost always as the cell size is reduced. The cell size to realize a capacity as large as gigabit or more is in the order of 100 nm. In this case, writing using a current magnetic field is difficult due to the limitation of the current density or the current amount which can be supplied. Therefore, a new method for inversion of magnetization which does not use a current magnetic field is desired.

One promising method for inversion of magnetization using no current magnetic field is inversion of magnetization by injection of a spin polarization current (hereinafter, referred to as "spin momentum transfer switching"). This is theoretically expected by Slonczewski in a CPP-GMR film. CPP means a current flowing in the direction perpendicular to the plane of a film, and is an abbreviation of "current perpendicular to plane".

Figure 9:
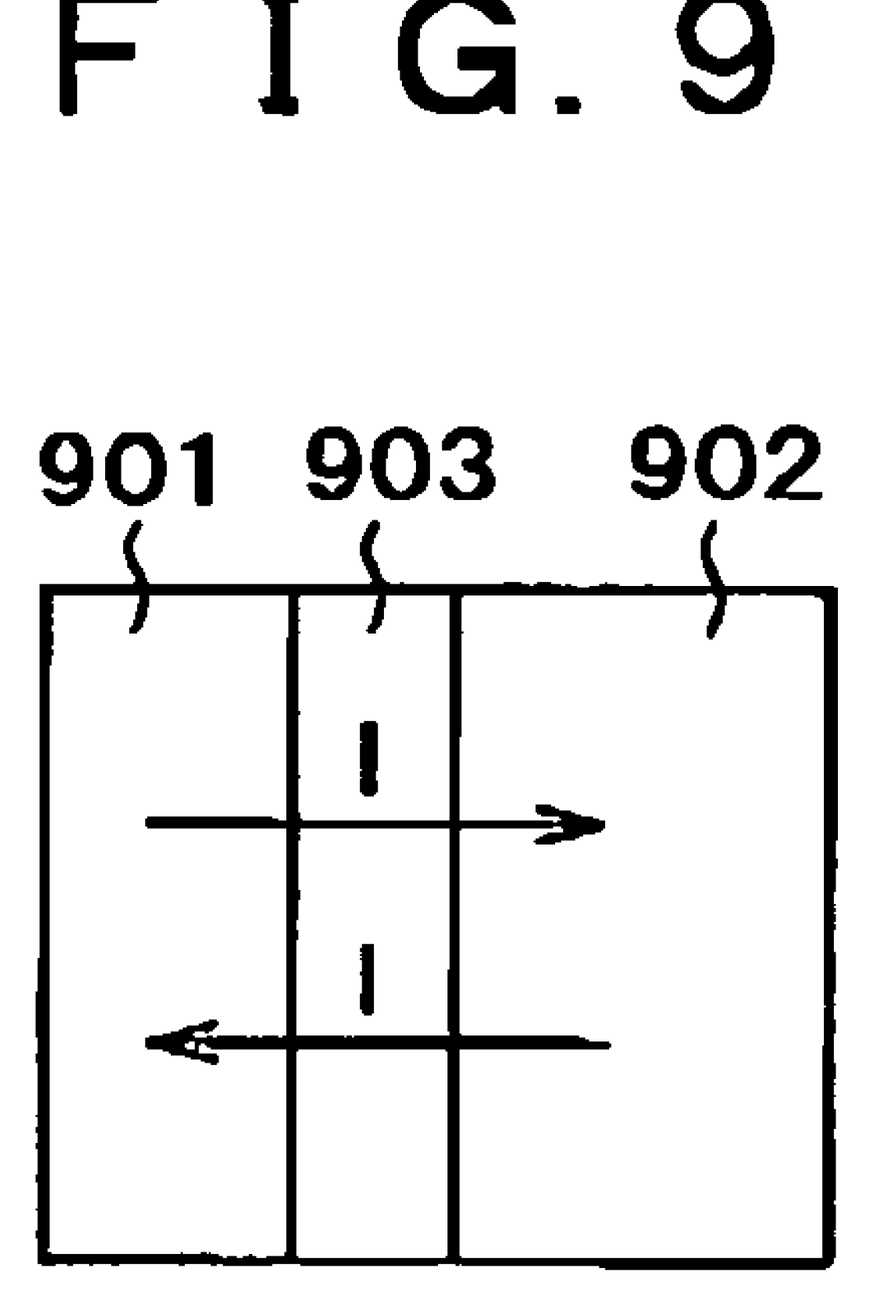
FIG. 9 is a diagrammatic cross-sectional view of a film construction for explaining inversion of magnetization by injection of a spin polarization current.

In a GMR film shown in FIG. 9, comprising three layers of first ferromagnetic film 901/nonmagnetic conductive film 903/second ferromagnetic film 902, the first ferromagnetic film 901 has a smaller thickness and the second ferromagnetic film 902 has a larger thickness, and a current I is permitted to flow in the direction perpendicular to the plane of the film. In this case, the spin angular momentum of current electrons is transferred to local magnetization spin in the first ferromagnetic film 901 to induce precession, thus causing inversion of magnetization of the first ferromagnetic film 901 at a certain value of critical current or more. The thicker second ferromagnetic film 902 has a thickness which is relatively satisfactorily large relative to the first ferromagnetic film 901 so that the direction of magnetization of the second ferromagnetic film 902 is not affected by the current, and functions as a spin filter. From this point of view, the first ferromagnetic film 901 is called free layer (or inversion layer), and the second ferromagnetic film 902 is called fixed layer. When electrons flow in the direction of from the first ferromagnetic film 901 to the second ferromagnetic film 902, the magnetizations of the first and second ferromagnetic films are stable in a state such that they are parallel and point in the same direction. In contrast, when electrons flow in the direction of from the second ferromagnetic film 902 to the first ferromagnetic film 901, the magnetizations are stable in a state such that they are parallel but point in the opposite direction. In other words, a relative angle between the magnetizations of the first and second ferromagnetic films 901, 902 can be controlled to be 0° or 180° by changing the direction of the flowing current I. This model has already been supported by a plurality of examinations.

In the spin momentum transfer switching, by allowing a current to flow in the direction perpendicular to the plane of a magnetic film, inversion of magnetization can be made, and therefore a word line for writing is not required, rendering the element structure extremely simple. The direction of the inversion of magnetization can be determined by adjusting the direction of the flowing current.

In the spin momentum transfer switching, the current value at the inversion of magnetization is, in principle, increased as the size of the memory cell is increased when the current density is fixed, and therefore it is desired that the size of the memory cell is smaller. In this point, in the ring-formed body comprised of a multilayer film having an MTJ formed by the method for preparing a ring-formed body of the present invention, the outer and inner diameters and the width of the ring-formed portion can be extremely small, making it possible to realize a cell volume such that inversion of magnetization can be achieved at such a practical current density that the element is not broken. In addition, in the ring-formed body comprised of a multilayer film having an MTJ formed by the method for preparing a ring-formed body of the present invention, the interfaces between the individual constituent layers can be arranged so as to be steep and parallel to one another, and therefore the ring-formed body is advantageously used in the magnetic memory device utilizing the spin momentum transfer switching.

As the memory element, various types of magnetoresistance effect films can be used. When using a GMR film, as mentioned above, the film construction can be a stacked structure comprising, for example, a ring-formed first soft magnetic film, a ring-formed nonmagnetic metal film (e.g., copper film), and a ring-formed second soft magnetic film having a coercive force (Hc) smaller than that of the first soft magnetic film in this order from the lower layer. As the soft magnetic film, for example, Co, Co—Fe, or the like may be used. The difference in coercive force (Hc) between the soft magnetic films can be controlled by changing the material for or thickness of the soft magnetic film (the larger the thickness, the larger the coercive force (Hc)). In this case, data (magnetization in the ring-formed body 15 in the clockwise or counterclockwise direction) is stored in the ring-formed soft magnetic film having a smaller coercive force (Hc), and the ring-formed soft magnetic film having a larger coercive force (Hc) is used as a reference layer in readout of the data and a source of spin polarization electron (spin polarization source). When the direction of magnetization of the reference layer magnetic film is fixed to one circumferential direction by an appropriate method, there is no need to cause a difference in the coercive force (Hc) between the two layers of soft magnetic films.

In stead of the GMR film, the TMR film described above can be used.

Figure 10A:
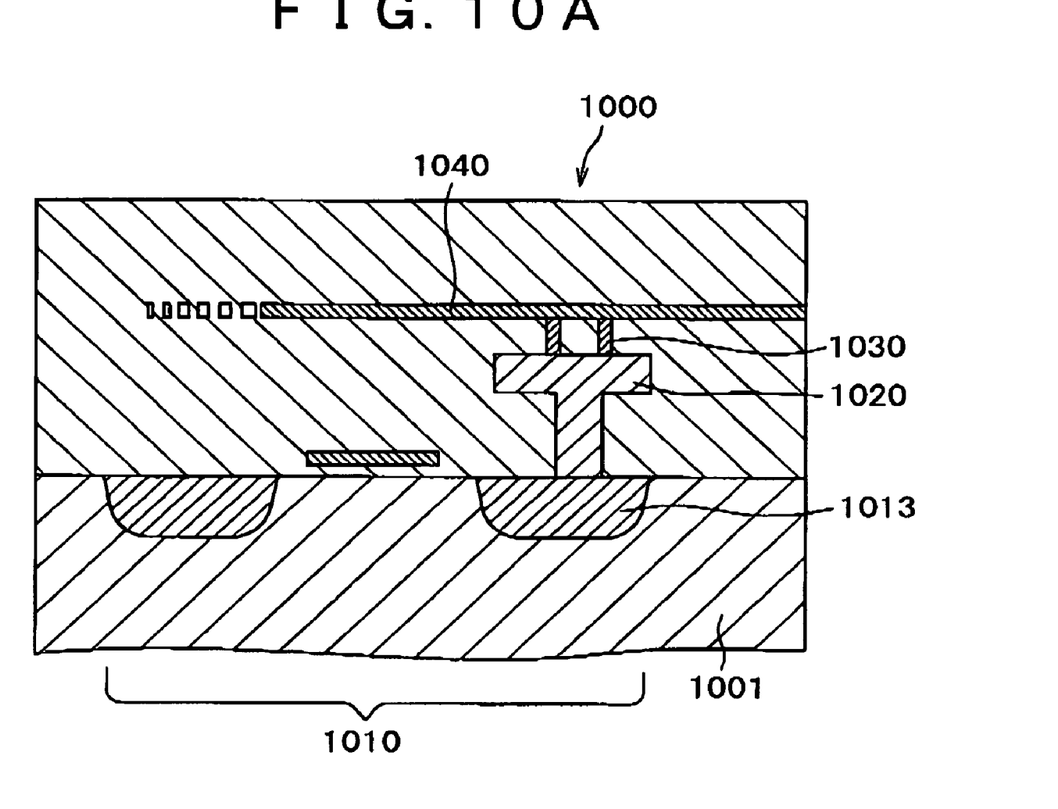
FIG. 10A is a diagrammatic cross-sectional view showing the construction.
Figure 10B:
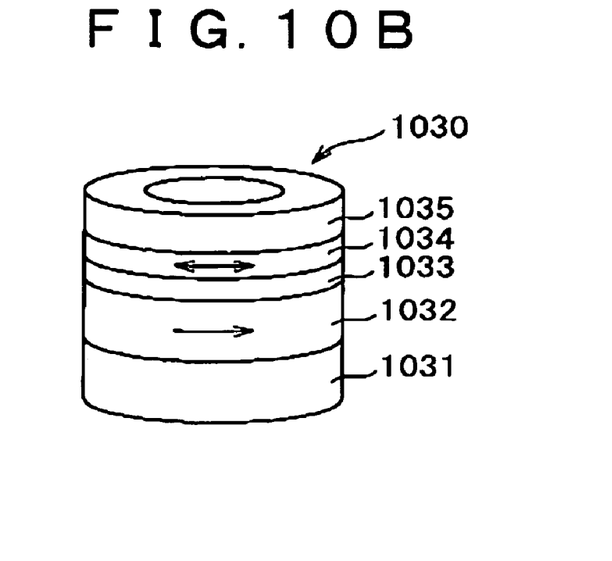
FIG. 10B is a perspective view of a memory cell.

Next, the magnetic memory device according to one embodiment of the present invention will be described with reference to FIGS. 10A and 10B. FIGS. 10A and 10B representatively show one cell in the MRAM utilizing spin momentum transfer switching, wherein FIG. 10A is a diagrammatic cross-sectional view showing the construction, and FIG. 10B is a perspective view of a memory cell.

As shown in FIGS. 10A and 10B, an MRAM 1000 is of a 1 transistor 1 junction (1T1J) type in which one transistor 1010 as an element for selection is provided per one memory cell 1030. Specifically, on a semiconductor substrate 1001, the transistor 1010 comprised of, for example, a field effect transistor is formed. An electrode 1020 is connected to a drain region 1013 of the transistor 1010. On the electrode 1020, the memory cell 1030 constituted by a ring-formed body comprised of a multilayer film having an MTJ is formed. On the memory cell 1030, a bit line 1040 for writing data is provided. To the bit line 1040 are connected a number of not shown memory cells.

As shown in FIG. 10B, the memory cell 1030 has a stacked structure comprising a reference layer 1032 comprised of a magnetic layer as a spin polarization source, a spacer 1033 comprised of a nonmagnetic layer, and a memory layer (also called free layer) 1034 comprised of a magnetic layer, and, for example, a primary layer 1031 may be formed under the reference layer 1032 and a conductive layer 1035 may be formed on the memory layer 1034.

As mentioned above, the memory cell 1030 has a basic structure comprising magnetic film (free layer)/nonmagnetic film/magnetic film (fixed layer), and a GMR film or a TMR film can be used. As the magnetic film, a soft magnetic material generally used, for example, Co, Ni—Fe, Co—Fe, Co—Fe—B, or the like can be used. The magnetic film may be of either a crystalline material or an amorphous material, and may be either a polycrystalline film or a single crystalline film. In addition to the above-mentioned metal films, a variety of magnetic semiconductors and semimetals can be used.

When using a GMR film as the nonmagnetic film, Cu is generally used. This is appropriately selected depending on the combination of magnetic materials. When using a TMR film, aluminum oxide ($Al_2O_3$) is generally used, but, for reducing the resistance, aluminum nitride (Al—N), zirconium aluminum nitride (Al—N—Zr), or the like can be used.

With respect to the structure of the fixed layer, an exchange coupled film comprising an antiferromagnetic film adjacent to a magnetic film of single layer is frequently used. As an advanced structure, a fixed layer having a stacked ferrimagnetic structure is also frequently used. This is a structure obtained by forming a three-layer structure comprising ferromagnetic film/Ru/ferromagnetic film on an antiferromagnetic film, and the above-mentioned various materials are used in the ferromagnetic film. The thickness of the Ru film is appropriately selected so that the interlayer exchange coupling in the two magnetic films becomes antiferromagnetic, but it is generally 0.7 to 0.8 nm.

The MRAM element 1000 can read and write data according to the current flowing the memory cell 1030 through the bit line 1040. Specifically, by allowing a current to flow at a current value at the inversion of magnetization of the memory layer 1034 in the memory cell 1030 or more, writing is conducted, and readout is made by such a weak current that inversion of magnetization is not caused. The current line required is only the bit line 1040 and hence the structure is very simple.

With respect to the size of the ring-formed body for the memory cell 1030 in the present embodiment, for example, the outer diameter is 120 nm, the inner diameter is 60 nm, the thickness is 3 nm, and the volume is about $25 \times 10^3$ $nm^3$. When the memory cell 1010 is comprised of a GMR film, the current density required for inversion of magnetization is in the order of $10^7$ $A/cm^2$. For realizing the spin momentum transfer switching at such a practical current density (in the order of $10^7$ $A/cm^2$ or less) that the memory cell 1030 is not broken at room temperature, it is necessary that the volume of the memory cell 1030 be about $25 \times 10^3$ $nm^3$ or less, and this can be realized in the above embodiment.

In the magnetic memory device 1000, inversion of the direction of magnetization of the memory layer 1034 can be achieved merely by means of a current without a magnetic field. Therefore, as mentioned above, the magnetic memory device 1000 can be applied to writing on the memory layer in a magnetic memory, such as an MRAM. In addition, when putting the magnetic memory device 1000 of the present invention into practical use, for meeting the demands of the memory cell having a single magnetic domain and lowering of the current at inversion, the cell size can be as small as about 200 nm or less, so that the demands of an increase of the memory capacity can be satisfied. Further, the smaller the memory cell 1030, the smaller the current required for the inversion. Therefore, readout and writing can be achieved only by a sense current. For example, readout can be performed by a small current and writing can be performed by a large current. Further, there is no semi-selection state in the current magnetic field writing, and therefore the magnetic memory device is thermally stable. In other words, the magnetic memory device has an advantage in that the resistance to thermal fluctuation is high. In addition, the structure of the element is considerably simplified, and a word line for writing needed in a conventional MRAM is not required and a by-pass line is not needed, and further the memory element 1030 can be arranged immediately above, for example, the transistor 1010 which serves as an element for selection. Accordingly, the magnetic memory device is advantageously used as a constituent of a large scale integrated circuit.

Next, the method for manufacturing a magnetic memory device according to one embodiment of the present invention will be described with reference to FIG. 11.

Figure 11:
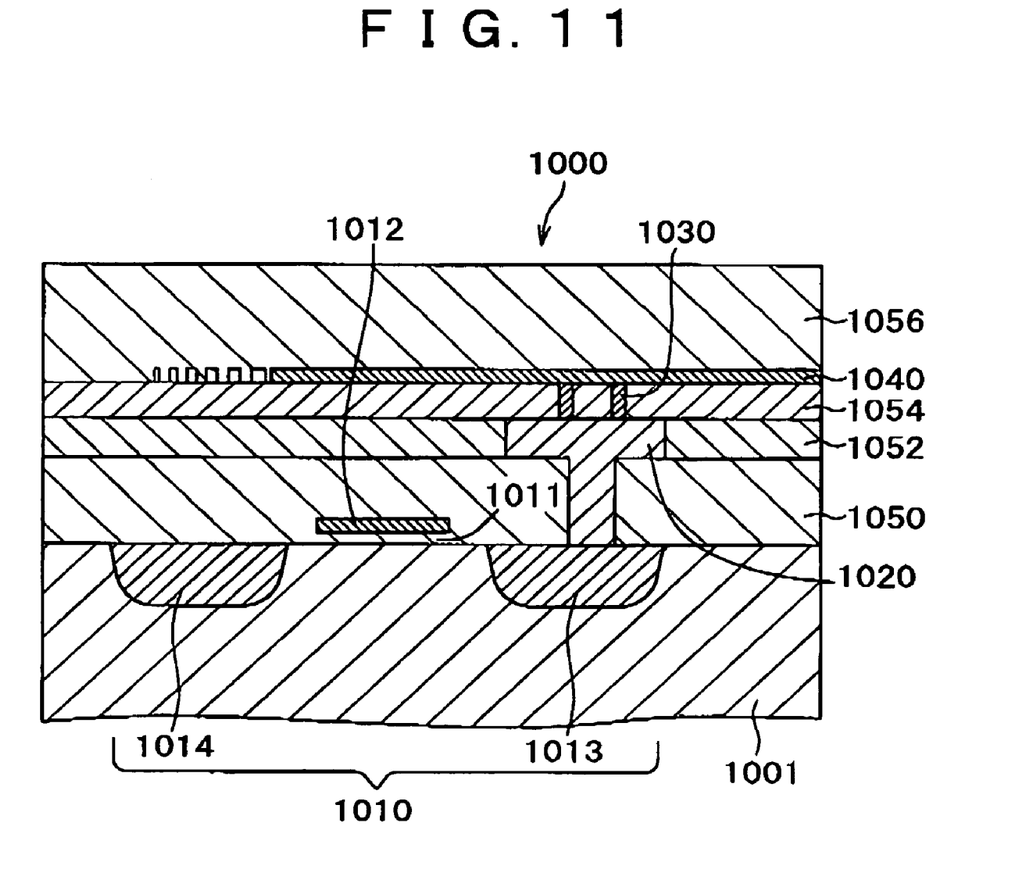
FIG. 11 is a diagrammatic cross-sectional view showing the construction of a method for manufacturing a magnetic memory device according to one embodiment of the present invention.

As shown in FIG. 11, in the method for manufacturing a magnetic memory device (e.g., MRAM) of the present invention, a transistor 1010 is formed on a semiconductor substrate 1001 by a method for forming a general field effect transistor. Specifically, a gate insulating film 1011 is formed on the semiconductor substrate 1001, and then a gate electrode 1012 is formed thereon. Then, a drain region 1013 and a source region 1014 are formed in the semiconductor substrate 1001 on both sides of the gate electrode 1012. Next, an insulating film 1050 for covering the transistor 1010 is formed, and then a contact hole is formed in the insulating film 1050 to be connected to the drain region 1013 of the transistor 1010, and then an electrode 1020 connected to the drain region 1013 is formed via the contact hole. Then, an insulating film 1052 is formed so as to cover the electrode 1020, followed by planarization of the surface, thus exposing the surface of the electrode 1020.

Next, using the method for preparing a ring-formed body of the present invention, a ring formed memory cell (magnetic memory element) 1030 connected to the electrode 1020, which stores data utilizing inversion of magnetization by spin implantation, is formed. In this case, as described above with reference to FIGS. 1F to 1H, the insulating film (16) and column (12) serve as an insulating film 1054 which is formed to embed the memory cell 1030 so that the upper surface of the memory cell 1030 is exposed.

Next, a bit line 1040 connected to the upper surface of the memory cell 1030 is formed on the insulating film 1054. Then, an insulating film 1056 for covering the bit line 1040 is formed. The bit line 1040 can be also formed by a technique for forming a trench wiring.

By the method for manufacturing a magnetic memory device, the magnetic memory device 1000 of the present invention can be easily produced. Specifically, the ring-formed memory cell 1030 is formed employing the method for preparing a ring-formed body of the present invention, and therefore the ring-formed memory cell 1030 can be easily produced from a ring-formed stacked film comprising a magnetic layer, a nonmagnetic layer, and a magnetic layer with high accuracy and high reproducibility.

In the method for manufacturing a magnetic memory device of the present invention, the inner diameter of the memory cell 1030 can be as small as, for example, about 80 nm, or the outer diameter of the memory cell can be as small as, for example, about 100 nm. The volume of the very small memory cell 1030 can be considerably lowered, enabling inversion of magnetization at a smaller current.

What is claimed is:

1. A magnetic memory device comprising:
   a magnetic memory element which stores data utilizing spin momentum transfer switching and which is formed in a ring-form;
   an electrode connected to a readout element for reading data stored in said magnetic memory element; and
   a bit line extending along an upper portion of the electrode,
   wherein:
   the magnetic memory element has a stacked structure comprising a magnetic layer, a nonmagnetic layer, and a magnetic layer, and is connected to both the electrode and the bit line.

2. The magnetic memory device as cited in claim 1, wherein: said magnetic memory element comprises of a ring-formed stacked film; and said stacked film includes a film formed by stacking a magnetic film, a nonmagnetic conductive film, and a magnetic film.

3. The magnetic memory device as cited in claim 1, wherein: said magnetic memory element comprises of a ring-formed stacked film; and said stacked film includes a film formed by stacking a magnetic film, a nonmagnetic insulating film, and a magnetic film.

* * * * *